United States Patent [19]

Khu

[11] Patent Number: 4,691,193
[45] Date of Patent: Sep. 1, 1987

[54] METHODS AND APPARATUS FOR ENCODING AND DECODING DATA TO AND FROM A (2,7) FORMAT

[75] Inventor: Arthur H. Khu, San Mateo, Calif.

[73] Assignee: Advanced Micro Devices, Inc., Sunnyvale, Calif.

[21] Appl. No.: 827,843

[22] Filed: Feb. 7, 1986

[51] Int. Cl.$^4$ ............................................. H03M 7/00
[52] U.S. Cl. ............................................. 340/347 DD
[58] Field of Search .................. 340/347 DD; 360/40

[56] References Cited

U.S. PATENT DOCUMENTS

4,463,344  7/1984  Adler ..................................... 360/40
4,567,464  1/1986  Siegel .......................... 340/347 DD Primary Examiner—Charles D. Miller
Attorney, Agent, or Firm—Patrick T. King; Joseph J. Kaliko

[57] ABSTRACT

Methods are set forth for constructing encoding and decoding state machines for preselected variable length fixed rate (2,7) codes. These state machines convert a variable length code to a state dependent fixed length fixed rate (2,7) code. Methods and apparatus are also disclosed for implementing a state dependent fixed length fixed rate (2,7) coding scheme in a manner that is simpler and inherently more reliable than the implementation of the corresponding variable length fixed rate (2,7) code. In addition, the disclosed methods and apparatus for implementing the state dependent code preserve the error recovery features of a variable length fixed rate (2,7) coding scheme.

32 Claims, 14 Drawing Figures

RLL (2,7) CODE TABLE

| DATA | CODE |
|---|---|
| 10 | 1000 |
| 11 | 0100 |
| 000 | 100100 |
| 010 | 001000 |
| 011 | 000100 |
| 0010 | 00001000 |
| 0011 | 00100100 |

FIG. 1

KEY: 0 (01) / 00
- CODE
- 2-BIT LOOKAHEAD
- DATA BIT

| CURRENT STATE | DATA | 1ST LOOK-AHEAD BIT | 2ND LOOK-AHEAD BIT | NEXT CURRENT STATE | OUTPUT CODE |
|---|---|---|---|---|---|
| 0 | 0 | 1 | X | X | 00 |
| 0 | 1 | 1 | X | 1 | 01 |
| 0 | 1 | 0 | X | 1 | 10 |
| 0 | 0 | 0 | 0 | 2 | 10 |
| 0 | 0 | 0 | 1 | 2 | 00 |
| 1 | X | X | X | 0 | 00 |
| 2 | 0 | 1 | 0 | 0 | 00 |
| 2 | 0 | 1 | 1 | 0 | 10 |
| 2 | 0 | 0 | X | 1 | 01 |

| CURRENT STATE | CODE BITS | 1ST LOOK-AHEAD BIT | 2ND LOOK-AHEAD BIT | NEXT CURRENT STATE | OUTPUT DATA |
|---|---|---|---|---|---|
| 0 | 10 | 0 | 1 | 1 | 0 |
| 0 | 10 | 0 | 0 | 2 | 1 |
| 0 | 00 | X | X | 3 | 0 |
| 0 | 01 | 0 | 0 | 4 | 1 |
| 1 | 01 | X | X | 2 | 0 |
| 2 | 00 | X | X | 0 | 0 |
| 3 | 10 | 0 | 1 | 0 | 0 |
| 3 | 10 | 0 | 0 | 2 | 1 |
| 3 | 01 | X | X | 4 | 1 |
| 3 | 00 | X | X | 5 | 0 |
| 4 | 00 | X | X | 0 | 1 |
| 5 | 10 | X | X | 2 | 1 |

FIG. 3B

| | |
|---|---|
| DATA : 1 0 1 1  0 0 1 1 | |
| CODE : 1000010 0  0010010 0 | |
| DETECTED: 1010010 0  0010010 0 | |
| (1) | [- -] = => ERROR; DECODE AS 0, STATE = 0 |
| (2) | [- -] = => VALID CODE, DECODE AS 0, STATE = 1 |
| (3) | [- -] = => VALID PATTERN; OUTPUT 0, STATE = 2 |
| (4) | [- -] = => DECODE AS 0 (SEE DECODE STATE DIAGRAM) |
| (5) | [- -] = => DECODING CONTINUES NORMALLY |

FIG. 4

| DATA | CODE |
|---|---|
| 10 | 1000 |
| 11 | 0100 |
| 000 | 100100 |
| 010 | 001000 |
| 011 | 000100 |
| 0010 | 00001000 |
| 0011 | 00100100 |

TABLE A: RLL 2,7 CODE

| DATA | CODE |
|---|---|
| 10 | 0100 |
| 11 | 1000 |
| 000 | 100100 |
| 010 | 001000 |
| 011 | 000100 |
| 0010 | 00001000 |
| 0011 | 00100100 |

TABLE B: EQUIVALENT RLL 2,7 CODE

| DATA | CODE |
|---|---|
| 01 | 1000 |
| 00 | 0100 |
| 111 | 100100 |
| 101 | 001000 |
| 100 | 000100 |
| 1101 | 00001000 |
| 1100 | 00100100 |

TABLE C: EQUIVALENT RLL 2,7 CODE COMPLIMENTING EACH DATA WORD FROM TABLE A

FIG. 5

|   | DATA | CODE |
|---|------|------|
| 1 | 1 0 | 1 0 0 0 |
| 2 | 1 1 | 0 1 0 0 |
| 3 | 0 0 0 | 1 0 0 1 0 0 |
| 4 | 0 1 0 | 0 0 1 0 0 0 |
| 5 | 0 1 1 | 0 0 0 1 0 0 |
| 6 | 0 0 1 0 | 0 0 0 0 1 0 0 0 |
| 7 | 0 0 1 1 | 0 0 1 0 0 1 0 0 |

NOW indicates row 1.

METHODS AND APPARATUS FOR ENCODING AND DECODING DATA TO AND FROM A (2,7) FORMAT

BACKGROUND OF THE INVENTION

1. Field of the Invention

The invention generally relates to run length limited (2,7) coding schemes often used in data storage and retrieval systems to increase the storage capacity of such systems and minimize the effects of detection errors when retrieving data. More particularly, the invention relates to methods and apparatus for encoding and decoding data to and from a (2,7) format via the construction and implementation of state machines which convert RLL (2,7) variable length fixed rate codes into state dependent fixed length fixed rate codes.

2. Description of the Related Art

Disk drive manufacturers are constantly striving to produce disk storage systems with the lowest cost per megabyte. This is to keep pace with the computer user's desire for more affordable disk space to store more programs and databases, and to archive large data files.

Present disk drive storage capacities can be increased three ways; by increasing the track density, increasing the number of read/write heads and disk surfaces, or by increasing the number of bits stored per inch. The first two approaches require a substantial amount of mechanical development and are therefore expensive. The third approach is the least expensive and can be achieved by modifying the way a disk data separator encodes and decodes data.

A method for increasing the amount of data recorded on disks or similar media or the rate at which data can be reliably transmitted through a channel is known as Run-Length Limited (RLL) coding.

RLL codes represent binary data in a magnetic medium by the presence or absence of magnetic transitions within slots of uniform width. Transitions are separated by a minumum of d slots to prevent intersymbol interference but not more than k slots which is required for self-clocking purposes. The codes may be referred to as (d,k) limited codes.

The run-length limited (RLL) (2,7) code is popular with disk drive manufacturers because it offers low intersymbol interference and has good error recovery properties. If there is an error in the readback signal the code corrects itself after a short run of correct code bits.

U.S. Pat. No. 3,689,899 to P. A. Franaszek, hereby incorporated by reference, describes a method for encoding and decoding a (2,7) code using logic blocks such as counters, memory elements, shift registers and gates. The data codes are variable length fixed rate codes. The coding rate for the (2,7) code is 2:1 (two code bits for each data bit) and the memory element containing the data dictionary consists of 7 variable length words, with lengths varying from 2 to 8 bits.

The prior art control logic, as taught in the U.S. Pat. No. 3,689,899 patent, required to encode and decode a variable length fixed rate (2,7) code, is embedded in the aforementioned logic blocks. The control logic has to determine when a bit string in the input shift register is a word in the (2,7) data dictionary. Care must be taken to allow enough time between shifting and, encoding or decoding to handle the variable length words. When a valid data string is found. the control logic initializes a counter with the length provided by the data dictionary, loads the output shift register with the coded or decoded value and shifts out the code/data at the 2:1/1:1 rate. Concurrently, the input shift register is being loaded with the next data/code bits from the bit stream at a 1:1/2:1 rate e.g., for decoding; for every data bit shifted out, two code bits are shifted in).

It has been determined that it would be desirable to reduce the amount of logic and timing signal constraints required to implement a variable length fixed rate (2,7) code while retaining the increased storage capacity benefit and error recovery features of such codes.

SUMMARY OF THE INVENTION

According to the invention, the desired reduction in logic required to implement a (2,7) code can be accomplished by converting the variable length fixed rate code into a state dependent fixed length fixed rate code using a maximum of 2 bits for lookahead.

Methods are disclosed for constructing encoding and decoding state machines for preselected variable length fixed rate (2,7) codes. These state machines perform the aforementioned conversion of a variable length code to a state dependent fixed length fixed rate (2,7) code.

In addition, the disclosed methods and apparatus for implementing the state dependent code preserve the error recovery features of a variable length fixed rate (2,7) coding scheme, i.e., error propagation as a result of a decoding/detection error, in a burst of 16 correct code bits, is still limited to 16 code bits (8 data bits).

According to the preferred embodiment of the invention, the combination of a programmable device, such as a programmable array logic (PAL) device, an input shift register and an output shift register, are used to implement the state dependent fixed length fixed rate (2,7) coding scheme. The input shift register will hold the data string to be encoded and the code string to be decoded. The output shift register will hold the result of the encoding and decoding operation of the PAL. The encoding and decoding operations may be conducted in response to simplified control signals which need only reflect the PAL code (encoding or decoding) and the data and code clock frequency.

It is a primary object of the invention to provide methods for constructing encoding and decoding state machines for preselected variable length fixed rate (2,7) codes where the state machines effectively convert the variable length fixed rate code into a state dependent fixed length fixed rate code using a maximum of 2 bits for lookahead.

It is a further object of the invention to provide methods and apparatus for implementing a state dependent fixed length fixed rate coding scheme.

Further yet, it is an object of the invention to retain the increased storage capacity benefit and error recovery features of a variable length fixed rate (2,7) coding scheme using simplified and inherently more reliable apparatus and method steps.

Other objects and features of the present invention will become apparent to those skilled in the art upon consideration of the following detailed description and the accompanying drawing, in which like reference designations represent like features throughout the figures.

DETAILED DESCRIPTION

Figure 1:
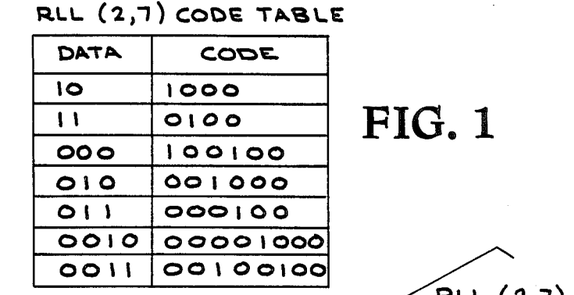
FIG. 1 depicts in tabular form the coding rules for a RLL (2,7) code.

Reference is made to FIG. 1 which depicts in tabular form the coding rules for a RLL (2,7) code. The depicted variable length code is well known to those skilled in the art and does not constitute a part of the present invention.

The left hand side of the table in FIG. 1 shows seven variable length data strings. Two of these strings are each two bits long, three of these strings are each three bits long and two more of the strings are each four bits long.

The codes corresponding to the seven data strings are either 4, 6 or 8 bits in length and are shown on the right hand side of the code table in FIG. 1 opposite each data string.

Figure 2A:
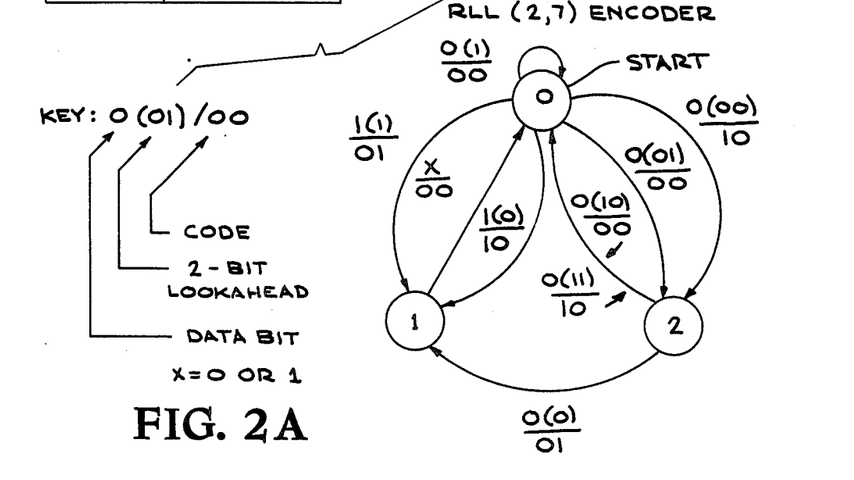
FIG. 2a state diagram for the encoder constructed for the RLL (2,7) variable length fixed rate code shown in FIG. 1, which converts the variable length code to a state dependent fixed length fixed rate (2,7) code.
Figure 2B:
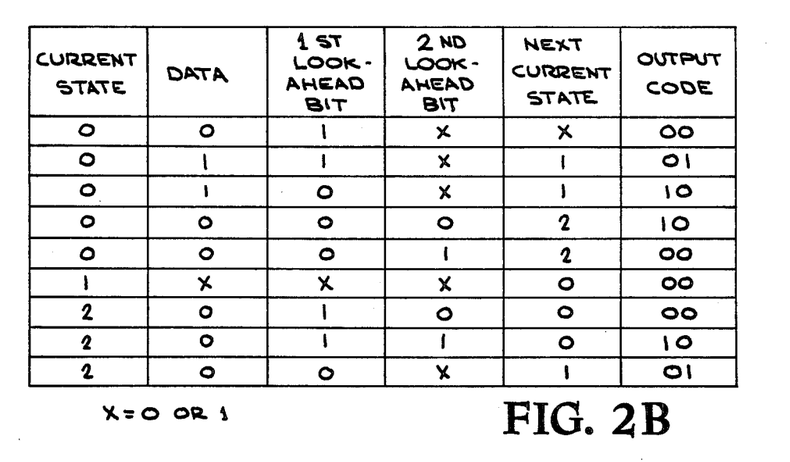
FIG. 2b depicts the state diagram in tabular form.
Figure 3A:
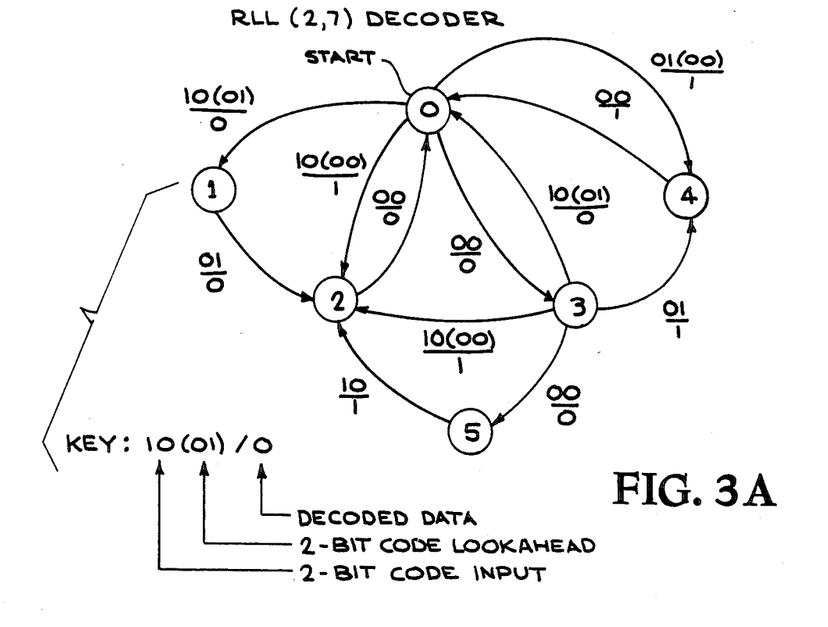
FIG. 3a depicts a state diagram for the decoder, constructed for the RLL (2,7) variable length fixed rate code shown in FIG. I, which converts the variable length code to a state dependent fixed length fixed rate (2,7) code.
Figure 3B:
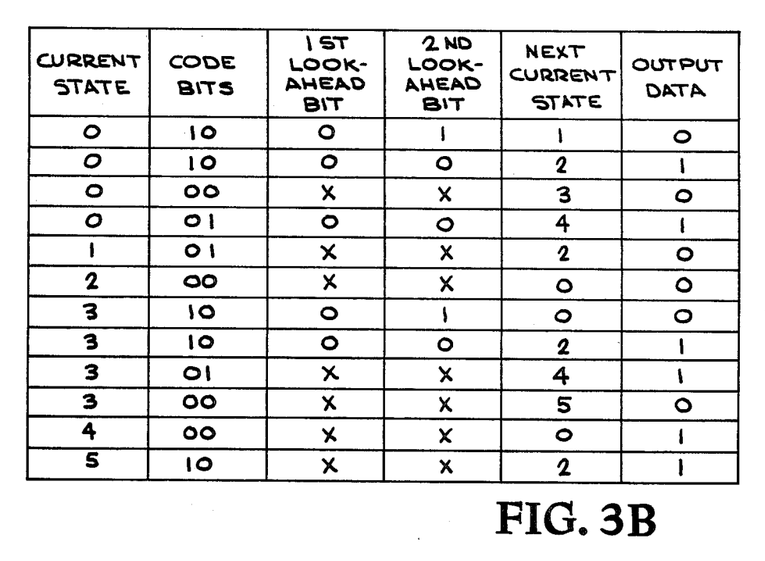
FIG. 3b depicts the state diagram in tabular form.

FIGS. 2a and 3a depict state diagrams that may be constructed using the coding rules shown in the table of FIG. 1. FIGS. 2b and 3b depict these same state diagrams in tabular form.

Methods for constructing the state diagrams and tables depicted in FIGS. 2a, 2b, 3a and 3b from code tables, such as the one illustrated in FIG. 1, are set forth in detail hereinafter with reference to FIGS. 5 and 6 and the written description pertaining thereto.

FIG. 2a shows a RLL (2,7) encoder state machine having three states. The "start" state is state 0. As indicated in the key on FIG. 2a, a data bit and two lookahead bits, together with the "current" state at any given point in time, determine the next state (next "current" state) and two bit output code.

Following the diagram from state 0, if a 0 data bit is to be encoded and a 1 is the first lookahead bit, the state machine stays in state 0 and outputs 00 as the code. If the first lookahead bit following a 0 data bit is also a 0, then the second lookahead bit will determine the output code. If the second lookahead bit is a 0, the code 10 is output and the state machine state indicators are set to "2" (i.e. goes to state 2). If the second lookahead bit is a 1, the code 00 is output and the state machine also goes to state 2. Finally, for state 0, if the data bit to be encoded is a 1, the state machine will go to state 1 and output a 01 code if the first lookahead bit is a 1 and a 10 code if the first lookahead bit is a zero.

The diagram in FIG. 2a also shows one possible code output from a machine in state 1 and three possible code outputs from a machine in state 2.

Being in state 2 implies a zero data bit is to be encoded. If the two lookahead bits are 10 or 11 the machine returns to state 0 outputting code 00 or 10 respectively. If the first lookahead bit is a 0, the machine goes to state 1 and outputs a 01 code. From state 1 the machine can only go to state 0 and always outputs a 00 code.

The state machine just described is shown in tabular form in FIG. 2b. In each case the current state, data bit, first lookahead bit and second lookahead bit definitively determine the next current state and output code, i.e. the next current state and output code are a function of the current state, data bit, first lookahead bit and second lookahead bit.

The step by step transition between states, data outputs, etc. may be seen for the decoding operation with reference to FIGS. 3a and 3b.

For decoding, the current state, code bit inputs (2 bits), first lookahead bit and second lookahead bit definitively determine the next current state and data bit output, i.e. for decoding the next current state and data bit output are a function of the current state, code bit inputs, first lookahead bit and second lookahead bit.

The tables shown in FIGS. 2b and 3b could each have been shown to have an additional entry which is useful to limit error propagation as a result of a detection error. This error recovery feature is inherent in a (2,7) code and is not lost by going from a variable length to fixed length coding scheme.

For the sake of illustration only, it can be assumed that an unrecognized data string will cause a 00 output from the represented encoder state machine and that the machine will go to state 0 and commence coding operations from state 0 on the string consisting of the next data bit and lookahead bit(s).

Similarly, for the sake of illustration, it can be assumed that an unrecognized code string wll cause a 0 output from the represented decoder state machine and the machine will go to state 0 and commence decoding operations from state 0 on the string consisting of the next two code bits and lookahead bit(s).

The aforementioned illustrative example is not meant to be limiting. For example, one could obviously output ones instead of zeros whenever an unrecognized code is detected without affecting the operation of the state dependent fixed length fixed rate state machines depicted.

A specific example of how the decoder state machine depicted in FIG. 3a would recover after a detection error is set forth hereafter for the sake of illustration and completeness. It will be demonstrated that the recovery properties of a (2,7) code are preserved performing the state dependent fixed length fixed rate coding. Those skilled in the art will readily appreciate that similar examples may easily be constructed for the encoding state machine of FIG. 2a, and indeed for at least the class of state machines that can be constructed by permutations of the rows of the (2,7) coding table shown in FIG. 1 and complementing of the data string column shown in FIG. 1 prior to permutating the rows. The methods for constructing this class of state machines from the code table shown in FIG. 1 will be described in detail hereinafter with reference to FIG. 5 following the error recovery example.

Figure 4:
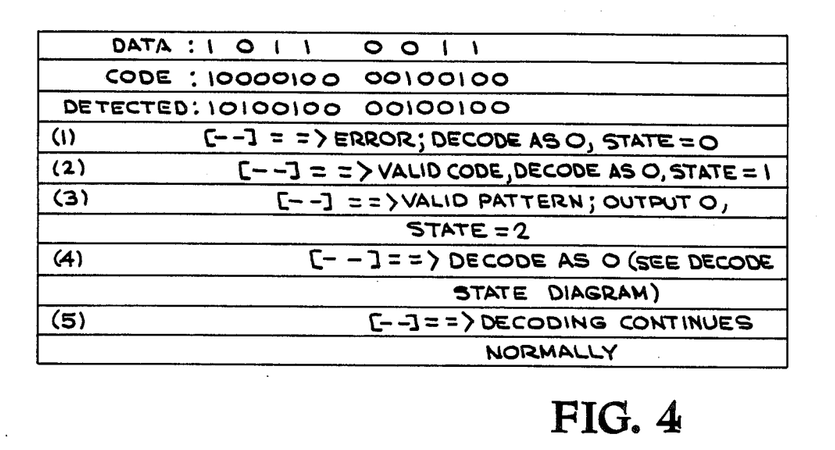
FIG. 4 depicts the steps involved in performing error recovery when decoding a code string in accordance with the teachings of the invention.

For the sake of explanation, the error recovery example assumes that the previous code bits have been correctly decoded and that the decoder state machine shown in FIG. 3a has returned to state 0. Reference should also be made to FIG. 4 to follow step by step the error recovery process.

If the next run of code bits is 1000 0100 (see FIG. 4), correctly decoded as 10 11, and the 3rd code bit from the left is incorrectly decoded as 1, then the code pattern 1010 (the first 4 bits of the pattern) will not be recognized because it is not one of the valid patterns recognized at state 0 (see the decoder state diagram in FIG. 3a and FIG. 4). According to the assumptions made hereinbefore, the unrecognized pattern will cause the decoder to go to (or remain) in state 0 and cause a 0 data bit to be output.

Again, the state machine could be constructed to output a 1 if the code is invalid without changing the substance of the error recovery features of the (2,7) code. Also, the decoding procedure is assumed to continue after the aforementioned output by using the prior two lookahead bits as new code bits to be decoded with the next two bits from the code string becoming the lookahead bits. This process is assumed to continue for the duration of the decoding procedure.

Assuming no other detection errors occur and assuming two code bits and two lookahead bits are examined at any one time, the code pattern 1001 is now detected. This is a valid code pattern and a 0 is decoded (but error recovery has not yet taken place). The state machine goes to state 1. Two more new bits from the code string are detected and the code pattern becomes 0100. In state 1 this decodes as 0 and the state is set to 2. 2 new bits replace the previous lookahead bits which become the code bits to be decoded. These bits are also valid and decoded as 0 and the state machine goes to state 0. The state machine has recovered at this point and the decoding process can now continue with the decoded data matching the actual encoded data.

By remaining at state 0 until a valid code input was recognized, the state machine is prepared for any valid inputs.

The above described error recovery steps are recapped as steps 1-5 in FIG. 4.

Having demonstrated that a state dependent fixed length fixed rate code preserves the error recovery features of a variable length (2,7) code, methods will now be described for generating state machines for any of the class of 48 equivalent RLL (2,7) coding tables that can be derived from the table shown in FIG. 1 via exchanging rows in the table or complementing the data string column of the aforesaid table prior to exchanging rows.

Figure 5:
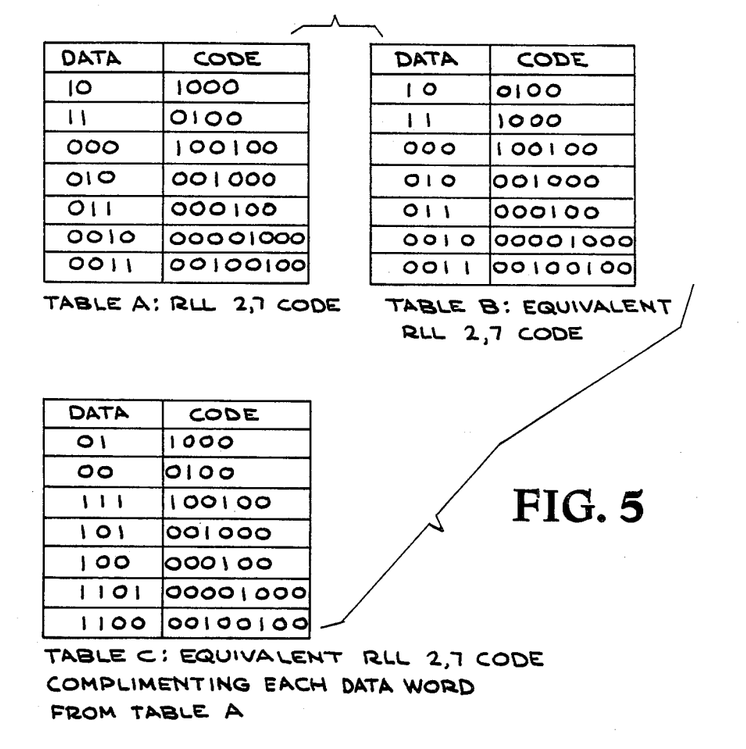
FIG. 5 depicts in tabular form several different RLL (2,7) variable length coding schemes which adhere to equivalent coding constraints.

Reference should now be made to FIG. 5 which depicts 3 equivalent RLL (2,7) coding tables: one which is the same as the table shown in FIG. 1, (shown as Table A); one with the first two rows of Table A exchanged (shown as Table B); and one with the data column complemented prior to performing the row exchange (shown as Table C).

The codes shown in FIG. 5 are "equivalent" because coding constraints observed for each table are the same, i.e. each "one" in a coded bit sequence must be separated from the nearest adjacent "one" by at least two "zeros", but not more then seven "zeros" (i.e. a (2,7) code) when the codes in a given table are appended to one another.

It should be noted that there are 24 possible permutations of the RLL (2,7) code Table A of FIG. 5 (24=2!*3!*2!), where 2!, 3! and 2! are the number of possible combinations of the 2,3 and 2 rows respectively, each row having the same number of elements. Table B of FIG. 5 is an example of one such permutation obtained by exchanging the first two rows (each with 2 elements) of Table A. Another set of 24 equivalent RLL (2,7) codes may be obtained by complementing the data string column while leaving the code string section intact. An example of one of these additional 24 code tables is shown as Table C of FIG. 5.

It should be noted that the term "code table" as used herein is meant to include both the actual tabular representation of a variable length fixed rate (2,7) code and any other representation of such a code capable of being put into the tabular form illustrated in FIGS. 1 and 5.

Methods for constructing encoding and decoding state machines for any of the aforementioned 48 coding tables are set forth hereinafter. First, a method for constructing encoding state machines will be set forth followed by the disclosure of a method for constructing decoding state machines.

After these methods are described, the novel methods and apparatus for implementing the state machines to effectively perform state dependent fixed length fixed rate (2,7) encoding and decoding will be described in detail.

The encoder state machine construction method starts with one data bit and two lookahead bits from the data stream. Current state information and these bits are used to produce two code bits and a new state. At most two lookahead bits are required to determine a unique next step.

For any of the class of RLL (2,7) code tables described hereinbefore with reference to FIG. 5, perform the following steps to develop the corresponding encoder state machine:

(1) Start by pairing each data bit in a given row with its two code bits.

(2) Assign a start state, e.g. state 0.

(3) Next, choose one of the 7 rows from a given table and examine the first data bit.

(4) Determine if the data bit is the second to the last data bit in the code table row. If so, then assign the data bit and the next lookahead data bit with its 2 code bit pair determined in step 1. If the data bit is not the 2nd to the last data bit, then assign the first data bit and the next 2 lookahead bits the two code bits corresponding to the data bit being coded.

(5) Create a new state and assign the next state transition to this state.

(6) Move to the next data bit in the row (new data bit).

(7) If the new data bit is the last data bit in the row, then assign to this one data bit its 2 bit code pattern pair and assign the next state transition to the start state and go to step 9.

(8) If the data string in the code table row is not yet finished, i.e., all bits have not been processed, go to step (4).

(9) When this row is finished, go back to state 0 and do the same steps (4 to 9) for the remaining rows in the code table.

For the decoder, the state machine construction method starts with two code bits and two lookahead code bits from the code stream. Current state information and these bits are used to produce one data bit and new state transition information.

For each row of a RLL (2,7) code table of the type described hereinbefore with reference to FIG. 5, perform the following steps to construct the corresponding decoder state machine:

(1) Match each 2 code bits to their corresponding data bit.

(2) Assign a start state, e.g., 0.

(3) Pick a row in the table and get the first 2 code bits.

(4) If the 2 code bits are the last two in the row being processed, then assign the 2 code bits to its data bit pair and assign the next state transition to the start state. Go to step (6). If the two code bits are not the last two, then assign to these two code bits and its two lookahead bits the data bit from the matching procedure (step 1).

(5) Create a new state and assign the state transition from the previous state to this state. Repeat step (4).

(6) When this row is finished, go back to state 0 and do the same steps (4 to 6) for the remaining rows in the code table.

When constructing an encoder or decoder state diagram the following steps may be used to reduce and minimize the number of states constructed using the above methods.

For each state in a state diagram (encoder or decoder):

(1) If the number of inputs, value of the outputs and next state transitions of a state A are exactly the same as the number of inputs, value of outputs and next state of a state B, then state A and B can be merged.

(2) The state transitions are left intact.

(3) Repeat steps 1 and 2 until no states have been removed.

The three step method set forth above is a standard state machine, state reduction technique not constituting a part of the present invention.

To illustrate how the state construction method work, reference should be made to FIG. 6a-6e which depict how the encoder state machine shown in FIG. 2 may be constructed from the code table shown in FIG. 1. The other encoder and decoder state machines in the class of machines exemplified in FIG. 5 may be constructed in a similar manner.

Figures 6A, 6B:
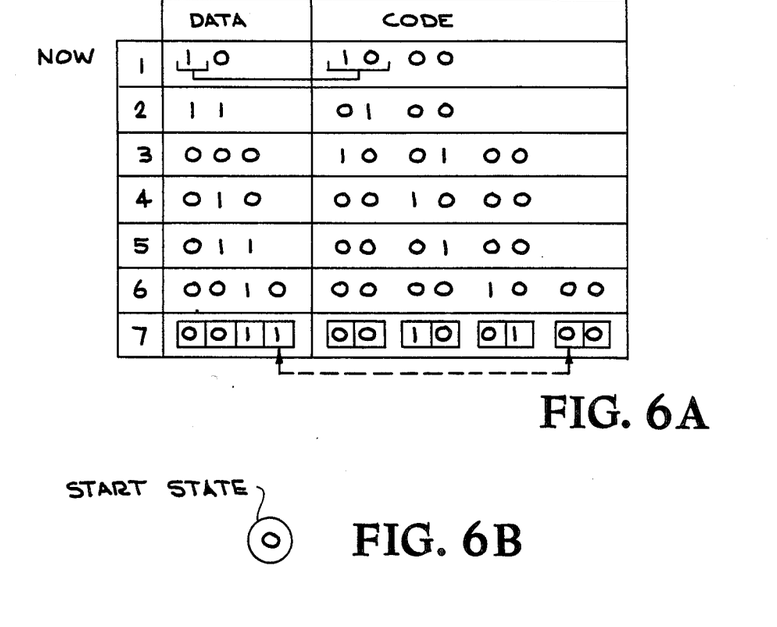
FIGS. 6a–6e depict an example of how an encoder state machine that converts a variable length fixed rate (2,7) code to a state dependent fixed length fixed rate (2,7) code may be constructed from a variable length (2,7) code table.

FIG. 6a depicts step 1 of the aforesaid construction method, namely the pairing of each data bit in the 7 rows to its corresponding 2 code bits.

FIG. 6b shows start state 0 (step 2 of the disclosed method). Assuming the state machine construction begins with row 1, (step 3), note data bit 1 is the second to the last data bit in row 1. A 0 is the only lookahead data bit. According to the method, (step 4), the data bit 1 and first lookahead bit 0 are assigned to the 2 bit pair 10, paired with the first data bit in step 1 (see FIG. 6a).

Figure 6C:
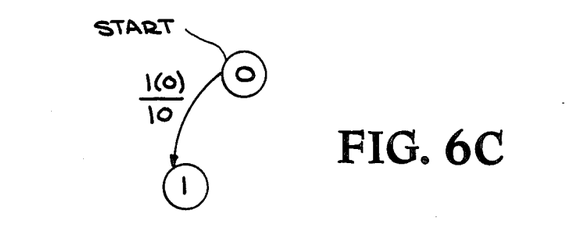

Using the notation: (X(Y)/Z)

Where X=data bit to be encoded, Y=lookahead bit(s) and Z=code bits; and following the next method step (step 5), state 1 is created (new state) and the transition diagram is as shown in FIG. 6c.

Figure 6D:
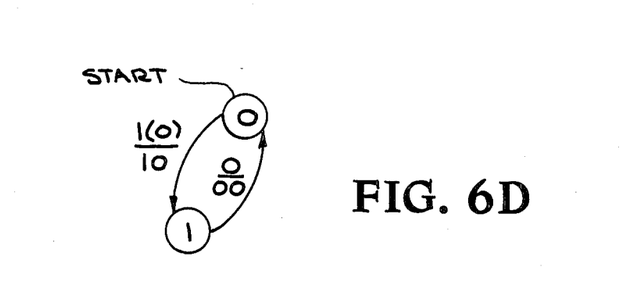

Next, moving to the next data bit, it is the last data bit in row 1, therefore the state transition is to state 0, (the start state), and the state diagram constructed to this point is shown in FIG. 6d.

Figure 6E:
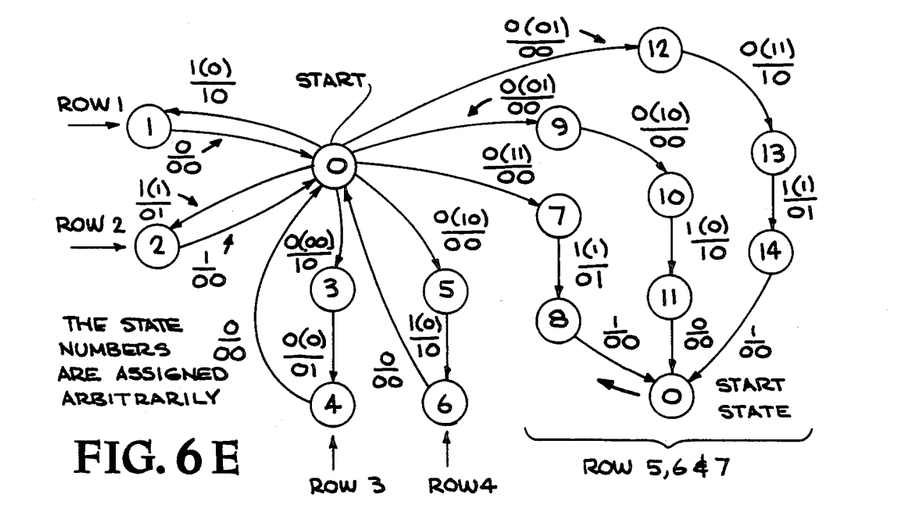

The same procedure applies to rows 2-7 until the complete diagram (unreduced) is as shown in FIG. 6e.

The aforementioned reduction techniques yield the state diagram shown in FIG. 2.

Again, any of the encoder and/or decoder state machines for the class of RLL (2,7) code described hereinbefore may be constructed in a similar manner.

Figure 7:
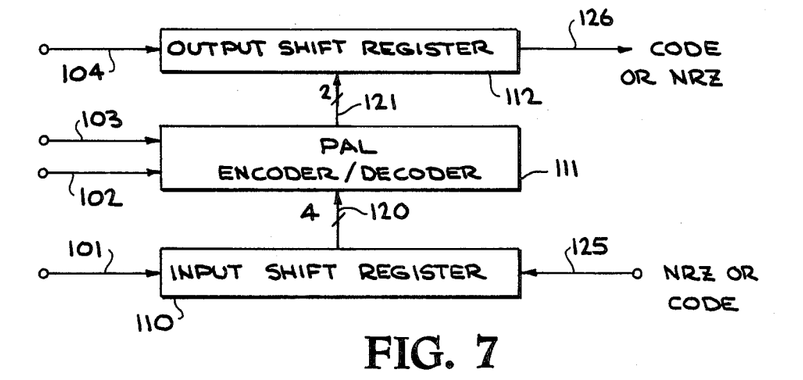
FIG. 7 depicts in block diagram form a suitable hardware configuration to implement state dependent fixed length fixed rate (2,7) coding and decoding.

Turning now to implementation, FIG. 7 depicts the preferred hardware configuration to implement both an RLL (2,7) encoder and decoder state machine. It will be apparent to those skilled in the art that modification may be made to this preferred configuration and still come within the teachings of this invention. The implementation of the state machines depicted in FIGS. 2 and 3 will be described with reference to FIG. 7 and the timing diagram shown in FIG. 8. This description will illustrate how any of the aforementioned state dependent fixed length fixed rate (2,7) coding or decoding schemes may be implemented.

With reference to FIG. 7, the depicted hardware comprises, input shift register 110, PAL encoder/decoder 111, and output shift register 112. Input shift register 110 is, according to the preferred embodiment of the invention, a 4 bit shift register and output shift register 112 is a 2 bit register.

PAL 111 is shown coupled to and capable of receiving bits from input shift register 110 via the four leads labled 120. PAL 111 is also shown coupled to and capable of outputting bits to output shift register 112 via the two leads labled 121.

Data (shown in FIG. 7 in accordance with the preferred embodiment as NRZ data) or code may be input to register 110 via lead 125.

Coded data and decoded information may be output via lead 126.

Leads 101-104 carry the timing/control and mode select signals required by the depicted hardware. The purpose, source and utilization of each of these signals and how the hardware responds will now be set forth in detail with reference to specific examples, first for performing encoding and then decoding.

Before proceeding with the example, it should be kept in mind that the PAL shown in FIG. 7 could for example, be another type of programmable device, the shift registers could be longer then the 4 and 2 bit registers used in the preferred embodiment and the source of timing signals could be a timing generator, another programmable device, etc., without departing from the scope or spirit of the invention.

To implement the preferred embodiment of the invention only standard, off the shelf components are required. The shift registers could be 74195 devices, while the encoder/decoder PAL could be realized with an AMPAL 22V10 device. In fact, any means which can implement state machines in the manner to be described hereinafter could be substituted for the PAL.

It is assumed for the instant example involving a programmable device such as PAL 111, that the device has been programmed to perform the mappings shown in the tables depicted in FIGS. 2 and 3 (including the transition to state 0 with a 0 data and 00 code output for unrecognized inputs). In other words, for encoding, a given data bit input together with current state information and lookahead information will definitively determine the next current state and output code. Similarly the decoding function is assumed to be programmed into PAL 111. This can be easily accomplished in a variety of ways well known to those skilled in the art. For example, a table lookup using the input as an index could be used to perform the mapping and will be assumed herein for the sake of illustration only.

An alternative arrangement to perform the mapping could involve forming the logical sum of products of terms which include state indication signals, appearing on selected PAL output pins, which are fed back to the PAL. After any encoding/decoding operation, the state machine could be set to the next state according to the appropriate state diagram by evaluating these product terms in the PAL to change the state indicator pin outputs. This could be accomplished by well known logic design techniques.

Assume also, for the sake of illustration only, that lead 103 supplies a mode selection signal to PAL 111. Lead 103 set "low" could signal encoding operations are to be performed, while lead 103 "high" could signal decoding. The important concept is that according to the preferred embodiment of the invention, device 111 is switchable and capable of operating in either mode. In an alternative embodiment nonswitchable devices each dedicated to performing encoding or decoding, would also be suitable to practice the invention.

Figure 8:
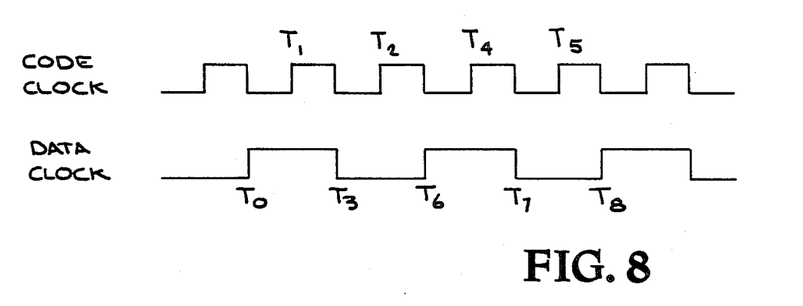
FIG. 8 depicts a timing diagram for controlling the operation of the shift registers and encoding/decoding device shown in FIG. 7 to accomplish state dependent fixed length fixed rate (2,7) coding and decoding.

Since (2,7) coding is being performed the code clock, data clock rate is 2:1, i.e. 2 code clock pulses for every data clock pulse. This is depicted in FIG. 8. Assuming these pulses are properly synchronized (again a timing generator, PAL, etc. would be suitable to generate these pulses), for encoding, the pulses shown in FIG. 8 as data clock are supplied to PAL 111 over lead 102, inverted data clock pulses are input to register 110 via lead 101 and the code clock pulses shown in FIG. 8 are input to register 112 via lead 104.

To follow through a specific encoding example, assume that at time $T_o$, 3 bits, XYZ, are in shift register 110 where X is the first bit to be encoded and YZ are the first and second lookahead bits respectively. $T_o$ is shown in FIG. 8 as the first rising edge of data clock.

If we assume encoding begins at $T_o$, the code output (and state) of encoding PAL 111 (its encoding since lead 103 is low) changes according to prior inputs (prior to the input of XYZ) in accordance with the state table mapping described hereinbefore and assumed for the sake of illustration to be incorporated in PAL 111.

At $T_1$ output shift register 112 is loaded with the output of PAL 111 defined hereinafter as the 2 bit code, X' and X'' associated with bit X. The actual encoding of bit X takes place between $T_o$ and $T_1$.

At $T_1$ one of the 2 code bits (assume its X') is immediately available as output. The other code bit, X'', is shifted out at $T_2$, i.e. the next rising code clock pulse.

At $T_3$ a new data bit is shifted into register 110. The control signal to shift register 110 is data clock inverted so that for encoding this is the rising edge of a pulse. In fact, all the devices shown in FIG. 7 are presumed to be leading edge triggered. However, obviously, this a non-limiting convention chosen for the sake of convenience and illustration only.

Upon shifting in the new data bit at $T_3$, (call it bit P), the input shift register holds YZ where Y (the new data bit to be encoded) was the previous first lookahead bit, Z (the new first lookahead bit) was the prior second lookahead bit and P is the new second lookahead bit.

Next, at $T_6$ Y is encoded (actually between $T_6$ and $T_4$) with PAL 111 again mapping the input bit, current state and lookahead bits into the predetermined output state and output code bits Y' and Y''. At $T_4$ output shift register 112 is loaded with Y' and Y'' for output at $T_4$ and $T_5$ respectively and the process repeats itself with another bit input to register 110 at $T_7$. Actual encoding begins again at $T_8$.

An illustration of how state dependent fixed length fixed rate decoding may be performed in accordance with the invention may be seen with reference to FIGS. 3, 7 and 8.

It is now assumed that the table in FIG. 3, or some other means for performing the mapping indicated in the table, is incorporated into PAL 111 or some similar device. Four bits from the code stream, ABCD, are assumed to be in input register 110. It is also assumed that lead 103 is "high" consistant with the previous example wherein encoding lead 103 was low.

It should be recalled for decoding that two code bits, two lookahead bits and current state information will determine the next current state for and data bit output from PAL 111.

For decoding, the data clock pulses (see FIG. 8) are again sent to PAL 111 via lead 102, the code clock (see FIG. 8) controls input shift register 110 via lead 101 and inverted data clock pulses this time control output shift register 112 via lead 104.

To follow through a specific decoding example, assume that the aforementioned bits, bits ABCD are in shift register 110 at time $T_o$ (again see FIG. 8). AB are the first two code bits and CD are the two lookahead bits. PAL 111 decodes AB at $T_o$. At $T_l$ the next code bit (E) is input to register 110. Similarly, at $T_2$ another coder bit (F) is clocked into register 110. Register 110 just after $T_2$ will hold the bit string CDEF, with the former two lookahead bits becoming the code bits and with EF becoming the new lookahead bits.

Recalling that the falling edges of data clock as shown in FIG. 8 (i.e., $T_3$, $T_7$, etc ) are inverted to control output shift register 112, at $T_3$ register 112 is loaded with the results of decoding AB.

At $T_6$ the decoding sequence is repeated with PAL 111 taking current state information, code bits CD and lookahead bits EF to determine new state information and the data bit to be loaded into register 112 at $T_7$.

The process keeps repeating with new code bits input to register 110 at $T_4$ and $T_5$ and the decoding of code bits EF at $T_8$, etc.

It should be observed that the state dependent fixed length fixed rate (2,7) coding scheme set forth hereinbefore did not require counters or the complicated logic required to implement a variable length fixed rate (2,7) coding scheme.

What has been set forth hereinbefore are methods for constructing encoding and decoding state machines for the class of variable length fixed rate (2,7) codes described with reference to FIG. 5. These state machines convert the variable length fixed rate (2,7) codes depicted in the tables to state dependent fixed length fixed rate (2,7) codes. Apparatus and methods for implementing state dependent fixed length fixed rate (2,7) codes have also been disclosed which meet all of the objectives set forth hereinbefore.

Said another way, the disclosed invention teaches taking an input stream (data or code), and inputting a fixed number of bits from the stream (1 for data; 2 for code) to the novel combination of apparatus shown in FIG. 7, at a fixed rate, together with lookahead information (2 bits according to the disclosed preferred embodiment of the invention), all of which are used as input to novel encoder and decoder state machines (as appropriate), which in turn develop fixed length, fixed rate, state dependent outputs (code from data inputs and vice versa, i.e., data from code inputs); along with next state information.

The disclosure set forth hereinbefore also teaches how to unambiguously and definitively construct the aforesaid state machines from preselected, variable length, (2,7) code dictionaries. These state machines effectively convert a variable length (2,7) coding scheme to the fixed length, fixed rate, state dependent (2,7) coding scheme which produces fixed length, fixed rate state dependent outputs (code or data as appropriate). The disclosed PAL, incorporating any of the well defined state machine lookup tables, is a specific example of means for converting a variable length (2,7) coding scheme to fixed length, state dependent form while preserving the well known data storage and error recovery features inherent in a variable length (2,7) coding scheme.

The foregoing description of a preferred embodiment of the novel methods and apparatus for achieving the objects of the invention has been presented for purposes of illustration and description. It is not intended to be exhaustive or to limit the invention to the precise form disclosed, and obviously many modifications and variations are possible in light of the above teaching. The embodiment was chosen and described in order to best explain the principles of the instant invention and its practical application to thereby enable others skilled in the art to best utilize the instant invention in various embodiments and with various modifications as are suited to the particular use contemplated. It is intended that the scope of the instant invention be defined by the claims appended hereto.

What is claimed is:

1. Apparatus for implementing a state dependent fixed length, fixed rate (2,7) coding scheme, used for converting, at said fixed rate, each of the data bits of a serial input data stream to a state dependent, fixed length (pair) of code bits, where successive pairs of said code bits are output serially as part of an output code stream which corresponds to said input data stream in coded form, comprising:
   (a) means for receiving at least three successive bits of data from said data stream wherein a first one of said bits is a data bit to be encoded, immediately followed by two of said bits which constitute a first lookahead bit and a second lookahead bit;
   (b) means, coupled to said means for receiving for synchronously outputting in parallel the set of bits comprised of said bit to be encoded and said first and second lookahead bits;
   (c) means, responsive to the output of said means for receiving, constructed from a variable length (2,7) code dictionary and having a preselected initial state, for effectively converting a variable length fixed rate (2,7) coding scheme to a state dependent fixed length fixed rate (2,7) coding scheme, used for developing said fixed length output code stream; and
   (d) means, coupled to said means for converting, for receiving said output code stream.

2. Apparatus as set forth in claim 1 wherein said means for converting generates an output code bit pair and enters a predetermined next state as a function of said bit to be encoded, said first and second lookahead bits and said preselected initial state.

3. Apparatus as set forth in claim 2 further comprising means coupled to said means for receiving said output code stream for synchronously outputting codes generated via the encoding process.

4. Apparatus as set forth in claim 3 further comprising means for synchronously clocking a new successive data bit from said data stream into said means for receiving data whereby said first lookahead bit replaces said bit to be encoded and becomes the new bit to be encoded, said second lookahead bit replaces said first lookahead bit and said new data bit replaces said second lookahead bit.

5. Apparatus as set forth in claim 4 wherein said means for converting is operative to iteratively generate a coded output and enter a new predetermined next state as a function of said new bit to be encoded and its associated lookahead bits each time a new data bit is input to said means for receiving data.

6. Apparatus as set forth in claim 5 wherein said means for receiving data comprises a shift register.

7. Apparatus as set forth in claim 5 wherein said means for converting is a programmable logic device.

8. Apparatus as set forth in claim 7 wherein said programmable logic device is a PAL.

9. Apparatus as set forth in claim 8 wherein the mapping associated with said function is performed by indexing a lookup table stored in said PAL with the current state of said means for converting, with said data bit to be encoded and the first and second lookahead bits associated with said bit to be encoded serving as indices to said table.

10. Apparatus as set forth in claim 8 wherein said PAL generates a state indicative output signal.

11. Apparatus as set forth in claim 10 wherein said state indicative output signal is fed back to said PAL and is used by said PAL to formulate a subsequent state indicative output signal.

12. Apparatus for implementing a state dependent fixed length fixed rate (2,7) coding scheme, used for converting, at said fixed rate, each successive pair of code bits of a serial input code stream to a state dependent, fixed length (single bit) data bit, where successive ones of said data bits are output serially as part of an output data stream which corresponds to said input code stream in decoded form, comprising:
   (a) means for receiving at least four successive bits of data from said code stream wherein a first pair of said bits to be decoded, immediately followed by two of said bits which constitute a first lookahead bit and a second lookahead bit;
   (b) means coupled to said means for receiving, for synchronously outputting in parallel the set of bits comprised of said bits to be decoded and said first and second lookahead bits;
   (c) means, responsive to the output of said means for receiving, constructed from a variable length (2,7) code dictionary and having a preselected initial state, for effectively converting a variable length fixed rate (2,7) coding scheme to a state dependent fixed length fixed rate (2,7) coding scheme, used for developing said fixed length output data stream; and
   (d) means, coupled to said means for converting, for receiving said data bit output.

13. Apparatus as set forth in claim 12 wherein said means for converting generates said data bit output and enters a predetermined next state as a function of said pair of code bits to be decoded, said first and second lookahead bits and said preselected initial state.

14. Apparatus as set forth in claim 13 further comprising means coupled to said means for receiving said data bit output for synchronously outputting data bits generated via the decoding process.

15. Apparatus as set forth in claim 14 further comprising means for synchronously clocking a new successive pair of code bits from said code stream into said means for receiving data whereby said first and second lookahead bits replace said bits to be decoded and become the new bits to be decoded and said new pair of code bits replaces said first and second lookahead bits.

16. Apparatus as set forth in claim 15 wherein said means for converting is operative to iteratively generate a data bit output and enter a new predetermined next state as a function of said new bits to be decoded and their associated lookahead bits each time a new pair of code bits is input to said means for receiving data.

17. Apparatus as set forth in claim 16 wherein said means for receiving data comprises a shift register.

18. Apparatus as set forth in claim 16 wherein said means for converting is a programmable logic device.

19. Apparatus as set forth in claim 18 wherein said programmable logic device is a PAL.

20. Apparatus as set forth in claim 19 wherein the mapping associated with said function is performed by indexing a lookup table stored in said PAL with the current state of said means for converting, with said pair of bits to be decoded and the first and second lookahead bits associated with said bits to be decoded serving as indices to said table.

21. Apparatus as set forth in claim 19 wherein said PAL generates a state indicative output signal.

22. Apparatus as set forth in claim 21 wherein said state indicative output signal is fed back to said PAL and is used by said PAL to formulate a subsequent state indicative output signal.

23. A method for implementing a state dependent fixed length fixed rate (2,7) coding scheme, used for converting, at said fixed rate, each of the data bits of a serial input data stream to a state dependent, fixed length (pair) of code bits, where successive pairs of said code bits are output serially as part of an output code stream which corresponds to said input data stream in coded form, comprising the steps of:
(a) receiving at least three successive bits of data from said data stream wherein a first one of said bits is a data bit to be encoded, immediately followed by two of said bits which constitute a first lookahead bit and a second lookahead bit;
(b) outputting in parallel the set of received bits comprised of said bit to be encoded and said first and second lookahead bits, synchronously;
(c) converting, in response to said set of received bits and via a state machine constructed from a variable length (2,7) code dictionary and having a preselected initial state, each data bit into one of said state dependent pairs of code bits ; and
(d) outputting each of said pairs of code bits associated with each data bit.

24. A method as set forth in claim 23 wherein, said step of converting is performed by generating each of said output code bit pairs and entering a predetermined next state as a function of said data bit to be encoded, said first and second lookahead bits and said preselected initial state.

25. A method as set forth in claim 24 further comprising the step of synchronously outputting said output bits generated via the encoding process.

26. A method as set forth in claim 25 further comprising the steps of synchronously clocking a new successive data bit from said data stream into a means for receiving data whereby said first lookahead bit replaces said bit to be encoded and becomes the new bit to be encoded, said second lookahead bit replaces said first lookahead bit and said new data bit replaces said second lookahead bit.

27. A method as set forth in claim 26 wherein said step of converting is performed iteratively to generate a coded output and enter a new predetermined next state as a function of said new bit to be encoded and its associated lookahead bits each time a new data bit is input to said means for receiving data.

28. A method for implementing a state dependent fixed length fixed rate (2,7) coding scheme, used for converting, at said fixed rate, each successive pair of code bits of a serial input code stream to a state dependent, fixed length (single bit) data bit, where successive ones of said data bits are output serially as part of an output data stream which corresponds to said input code stream in decoded form, comprising the steps of:
(a) receiving at least four successive bits of data from said code stream wherein a first pair of said bits are to be decoded, immediately followed by two of said bits which constitute a first lookahead bit and a second lookahead bit;
(b) outputting in parallel the set of received bits comprised of said bits to be decoded and said first and second lookahead bits, synchronously;
(c) converting, in response to said set of received bits and via a state machine constructed from a variable length (2,7) code dictionary and having a preselected initial state, each pair of code bits into one of said state dependent data bits; and
(d) outputting each of said data bits associated with each decoded pair of code bits.

29. A method as set forth in claim 28 wherein said step of converting is performed by generating said data bit output and entering a predetermined next state as a function of said pair of bits to be decoded, said first and second lookahead bits and said preselected initial state.

30. A method as set forthe in claim 29 further comprising the step of synchronously outputting said data bits generated via the decoding process.

31. A method as set forth in claim 30 further comprising the steps of synchronously clocking a new successive pair of code bits from said code stream into a means for receiving data whereby said first and second lookahead bits replace said bits to be decoded and become the new bits to be decoded and said new pair of code bits replaces said first and second lookahead bits.

32. A method as set forth in claim 31 wherein said step of converting is performed iteratively to generate a data bit output and enter a new predetermined next state as a function of said new bits to be decoded and their associated lookahead bits each time a new pair of code bits is input to said means for receiving data.

* * * * *